US006861197B2

United States Patent
Harada et al.

(10) Patent No.: US 6,861,197 B2
(45) Date of Patent: Mar. 1, 2005

(54) POLYMERS, RESIST COMPOSITIONS AND PATTERNING PROCESS

(75) Inventors: Yuji Harada, Nakakubiki-gun (JP); Jun Watanabe, Nakakubiki-gun (JP); Jun Hatakeyama, Nakakubiki-gun (JP); Yoshio Kawai, Nakakubiki-gun (JP); Masaru Sasago, Hirakata (JP); Masayuki Endo, Izumi (JP); Shinji Kishimura, Itami (JP); Michitaka Ootani, Kawagoe (JP); Satoru Miyazawa, Kawagoe (JP); Kentaro Tsutsumi, Kawagoe (JP); Kazuhiko Maeda, Chiyoda-ku (JP)

(73) Assignees: Shin-Etsu Chemical Co., Ltd., Tokyo (JP); Matsushita Electric Industrial Co., Ltd., Kadoma (JP); Central Glass Co., Ltd., Ube (JP)

(*) Notice: Subject to any disclaimer, the term of this patent is extended or adjusted under 35 U.S.C. 154(b) by 188 days.

(21) Appl. No.: 10/084,828

(22) Filed: Feb. 28, 2002

(65) Prior Publication Data

US 2003/0008231 A1 Jan. 9, 2003

(30) Foreign Application Priority Data

Feb. 28, 2001 (JP) ........................................ 2001-053664
Feb. 28, 2001 (JP) ........................................ 2001-053669

(51) Int. Cl.$^7$ ............................................. G03F 7/039
(52) U.S. Cl. .................... 430/270.1; 430/907; 430/925; 430/325; 430/330; 430/967
(58) Field of Search ............................ 430/270.1, 905, 430/925, 325, 330, 967, 907

(56) References Cited

U.S. PATENT DOCUMENTS

| 4,491,628 | A | | 1/1985 | Ito et al. |
| 4,661,573 | A | * | 4/1987 | Ratkowski et al. ......... 526/245 |
| 5,310,619 | A | | 5/1994 | Crivello et al. |
| 5,923,397 | A | * | 7/1999 | Bonafini, Jr. ............ 351/160 R |
| 6,090,518 | A | * | 7/2000 | Niinomi et al. ............. 430/170 |
| 6,369,179 | B1 | * | 4/2002 | Stacey et al. ............... 526/245 |
| 6,582,880 | B2 | * | 6/2003 | Harada et al. ........... 430/270.1 |
| 2002/0061464 | A1 | * | 5/2002 | Aoai et al. ............... 430/270.1 |
| 2002/0115883 | A1 | * | 8/2002 | Ogata et al. ................ 560/219 |
| 2002/0161148 | A1 | * | 10/2002 | Harada et al. .............. 526/242 |
| 2003/0114619 | A1 | * | 6/2003 | Suyal et al. ................ 526/286 |

FOREIGN PATENT DOCUMENTS

| JP | 63027829 A | 2/1988 |
| JP | 90027660 B | 6/1990 |
| JP | 09073173 A | 3/1997 |
| JP | 09230595 A | 9/1997 |
| JP | 10010739 A | 1/1998 |
| WO | WO 97/33198 | 9/1997 |

* cited by examiner

*Primary Examiner*—Yvette C. Thornton
(74) *Attorney, Agent, or Firm*—Millen, White, Zelano, Branigan, P.C.

(57) ABSTRACT

A base polymer having incorporated an ester group having a fluorinated alicyclic unit is provided. A resist composition comprising the polymer is sensitive to high-energy radiation, and has excellent sensitivity at a wavelength of less than 200 nm, significantly improved transparency by virtue of the fluorinated alicyclic units incorporated as well as satisfactory plasma etching resistance. The resist composition has a low absorption at the exposure wavelength of a $F_2$ laser and is ideal as a micropatterning material in VLSI fabrication.

22 Claims, No Drawings

POLYMERS, RESIST COMPOSITIONS AND PATTERNING PROCESS

This invention relates to polymers useful as the base resin in resist compositions suited for microfabrication. It also relates to resist compositions, especially chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. To the demand for a resist material with a higher resolution and sensitivity, acid-catalyzed chemical amplification positive working resist materials are effective as disclosed in U.S. Pat. Nos. 4,491,628 and 5,310,619 (JP-B 2-27660 and JP-A 63-27829). They now become predominant resist materials especially adapted for deep UV lithography. Also, the change-over from i-line (365 nm) to shorter wavelength KrF laser (248 nm) brought about a significant innovation. Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated.

For ArF laser (193 nm), it is expected to enable miniaturization of the design rule to 0.13 μm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ laser (157 nm) which is expected to enable further miniaturization to 0.10 μm or less, more difficulty arises in insuring transparency because it was found that acrylic resins which are used as the base resin for ArF are not transmissive to light at all and those cycloolefin resins having carbonyl bonds have strong absorption. It was also found that poly(vinyl phenol) which is used as the base resin for KrF has a window for absorption in proximity to 160 nm, so the transmittance is somewhat improved, but far below the practical level.

SUMMARY OF THE INVENTION

An object of the invention is to provide a novel polymer having a high transmittance to vacuum ultraviolet radiation of up to 300 nm, especially $F_2$ laser beam (157 nm), $Kr_2$ laser beam (146 nm), KrAr laser beam (134 nm) and $Ar_2$ laser beam (126 nm), and useful as the base resin in a resist composition. Another object is to provide a resist composition, especially chemically amplified resist composition, comprising the polymer, and a patterning process using the same.

It has been found that using a base polymer having incorporated therein an ester group having a fluorinated alicyclic unit, a resist composition, especially chemically amplified resist composition having a drastically improved transparency and dry etching resistance is obtained.

In a first aspect, the invention provides a polymer containing a group of the following general formula (1) and having a weight average molecular weight of 1,000 to 500,000.

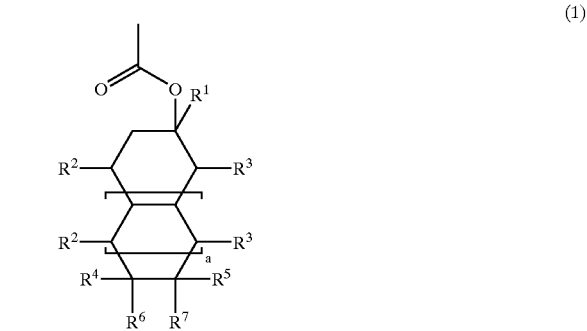

Herein $R^1$ to $R^3$ each are hydrogen, fluorine or a straight, branched or cyclic alkyl or fluorinated alkyl group of 1 to 20 carbon atoms, $R^2$ and $R^3$ may bond together to form a ring and in that event, each is an alkylene group of 1 to 20 carbon atoms which may contain a hetero atom such as oxygen, sulfur or nitrogen; $R^4$ and $R^5$ each are hydrogen or fluorine; $R^6$ and $R^7$ each are hydrogen, fluorine or a straight, branched or cyclic alkyl or fluorinated alkyl group of 1 to 20 carbon atoms, at least one of $R^6$ and $R^7$ contains at least one fluorine atom, $R^6$ and $R^7$ may bond together to form a ring and in that event, each is a straight, branched or cyclic alkylene or fluorinated alkylene group of 1 to 20 carbon atoms; and "a" is 0 or 1.

The group of formula (1) is preferably a group of the following general formula (1a).

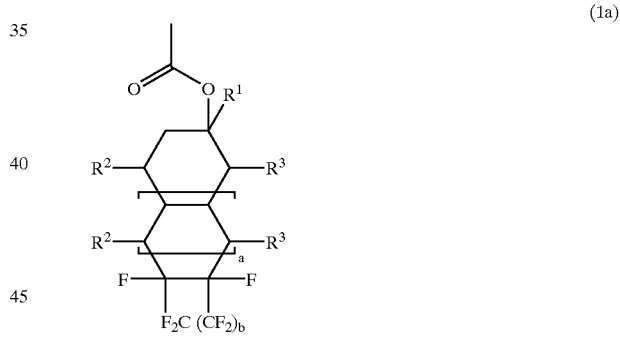

Herein $R^1$ to $R^3$ each are hydrogen, fluorine or a straight, branched or cyclic alkyl or fluorinated alkyl group of 1 to 20 carbon atoms, $R^2$ and $R^3$ may bond together to form a ring and in that event, each is an alkylene group of 1 to 20 carbon atoms which may contain a hetero atom such as oxygen, sulfur or nitrogen, "a" is 0 or 1, and "b" is an integer of 1 to 4.

Preferably, the polymer has a partial structure of any one of the following general formulae (2-1) to (2-5).

-continued

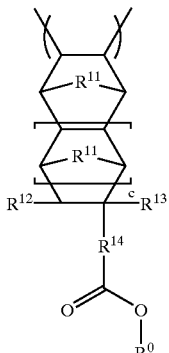
(2-2)

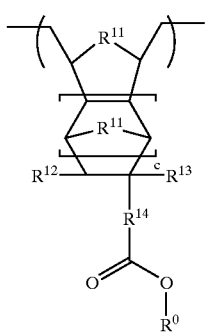
(2-3)

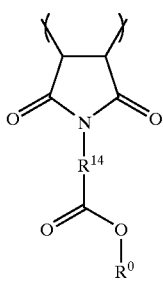
(2-4)

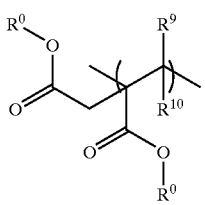
(2-5)

Herein $R^0$ is a group of formula (1) or formula (1a); $R^8$ to $R^{10}$ each are hydrogen, fluorine or a straight, branched or cyclic alkyl or fluorinated alkyl group of 1 to 20 carbon atoms; $R^{11}$ is a methylene group, oxygen atom or sulfur atom; $R^{12}$ and $R^{13}$ each are hydrogen, methyl or $CH_2CO_2R^{15}$; $R^{14}$ is a straight, branched or cyclic alkylene or fluorinated alkylene group of 1 to 20 carbon atoms; $R^{15}$ is a straight, branched or cyclic alkyl or substituted alkyl group of 1 to 20 carbon atoms; and "c" is 0 or 1.

In a second aspect, the invention provides a resist composition comprising the polymer defined above, and specifically, a chemically amplified, positive resist composition comprising (A) the polymer defined above, (B) an organic solvent, and (C) a photoacid generator. The resist composition may further include (D) a basic compound and (E) a dissolution inhibitor.

In a third aspect, the invention provides a process for forming a resist pattern comprising the steps of applying the resist composition onto a substrate to form a coating; heat treating the coating and then exposing it to high-energy radiation in a wavelength band of 100 to 180 nm or 1 to 30 nm through a photo mask; and optionally heat treating the exposed coating and developing it with a developer. The high-energy radiation is typically an $F_2$ laser beam, $Ar_2$ laser beam or soft x-ray.

For improving the transmittance in proximity to 157 nm, reducing the number of carbonyl groups and/or carbon-to-carbon double bonds is contemplated to be one effective way. It was also found that introducing fluorine atoms into base polymers makes a great contribution to improved transmittance. In fact, poly(vinyl phenol) having fluorine introduced in its aromatic rings offers a transmittance nearly on a practically acceptable level. However, this base polymer was found to turn to be negative upon exposure to high-energy radiation as from an $F_2$ laser, interfering with its use as a practical resist. In contrast, those polymers obtained by introducing fluorine into acrylic resins or polymers containing in their backbone an alicyclic compound originating from a norbornene derivative have been found to be suppressed in absorption and overcome the negative turning problem. In particular, polymers having a fluorinated alicyclic unit incorporated in an ester side chain according to the invention have a high transmittance in proximity to 157 nm and excellent resistance to dry etching.

DESCRIPTION OF THE PREFERRED EMBODIMENT

Polymer

According to the invention, the polymers or high molecular weight compounds are defined as containing a group of the following general formula (1) and having a weight average molecular weight of 1,000 to 500,000.

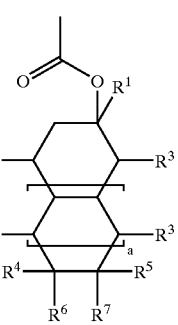
(1)

Herein $R^1$ to $R^3$ each are hydrogen, fluorine or a straight, branched or cyclic alkyl or fluorinated alkyl group of 1 to 20 carbon atoms, $R^2$ and $R^3$ may bond together to form a ring and in that event, each is an alkylene group of 1 to 20 carbon atoms which may contain a hetero atom such as oxygen, sulfur or nitrogen; $R^4$ and $R^5$ each are hydrogen or fluorine; $R^6$ and $R^7$ each are hydrogen, fluorine or a straight, branched or cyclic alkyl or fluorinated alkyl group of 1 to 20 carbon atoms, at least one of $R^6$ and $R^7$ contains at least one fluorine atom, $R^6$ and $R^7$ may bond together to form a ring and in that event, each is a straight, branched or cyclic alkylene or fluorinated alkylene group of 1 to 20 carbon atoms; and "a" is 0 or 1.

In one preferred embodiment, the group of formula (1) wherein $R^6$ and $R^7$ bond together to form a ring is a group of the following general formula (1a).

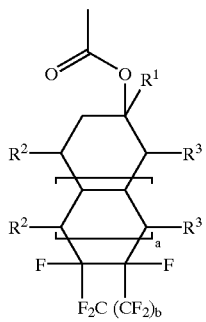

(1a)

Herein $R^1$ to $R^3$ each are hydrogen, fluorine or a straight, branched or cyclic alkyl or fluorinated alkyl group of 1 to 20 carbon atoms, $R^2$ and $R^3$ may bond together to form a ring and in that event, each is an alkylene group of 1 to 20 carbon atoms which may contain a hetero atom such as oxygen, sulfur or nitrogen, "a" is 0 or 1, and "b" is an integer of 1 to 4.

In formulae (1) and (1a), $R^1$ to $R^3$ are independently hydrogen, fluorine or straight, branched or cyclic alkyl or fluorinated alkyl groups of 1 to 20 carbon atoms. $R^2$ and $R^3$ may bond together to form a ring and in that event, each of $R^2$ and $R^3$ is an alkylene group of 1 to 20 carbon atoms which may contain a hetero atom such as oxygen, sulfur or nitrogen. $R^4$ and $R^5$ each are hydrogen or fluorine. $R^6$ and $R^7$ are independently hydrogen, fluorine or straight, branched or cyclic alkyl or fluorinated alkyl group of 1 to 20 carbon atoms, and at least one of $R^6$ and $R^7$ contains at least one fluorine atom. $R^6$ and $R^7$ may bond together to form a ring and in that event, each of $R^6$ and $R^7$ is a straight, branched or cyclic alkylene or fluorinated alkylene group of 1 to 20 carbon atoms. The subscript "a" is equal to 0 or 1, and "b" is an integer of 1 to 4.

More particularly, the straight, branched or cyclic alkyl groups are those of 1 to 20 carbon atoms, preferably of 1 to 12 carbon atoms, and especially of 1 to 10 carbon atoms, for example, methyl, ethyl, propyl, isopropyl, n-propyl, sec-butyl, tert-butyl, cyclopentyl, cyclohexyl, 2-ethylhexyl and n-octyl. The fluorinated alkyl groups correspond to the foregoing alkyl groups in which some or all of the hydrogen atoms are substituted with fluorine atoms, and include, for example, trifluoromethyl, 2,2,2-trifluoroethyl, 3,3,3-trifluoropropyl, 1,1,1,3,3,3-hexafluoroisopropyl and 1,1,2,2,3,3,3-heptafluoropropyl. The alkylene and fluorinated alkylene groups of 1 to 20 carbon atoms correspond to the aforementioned alkyl and fluorinated alkyl groups of 1 to 20 carbon atoms, preferably of 1 to 12 carbon atoms, and especially of 1 to 10 carbon atoms, with one hydrogen atom being eliminated therefrom.

The preferred polymers having a group of formula (1) or (1a) are polymers comprising recurring units of any one of the following general formulae (2-1) to (2-5).

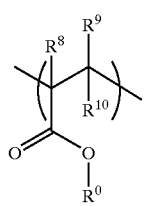

(2-1)

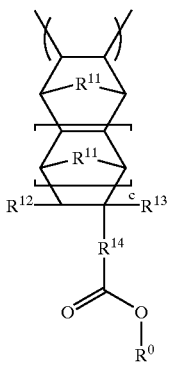

(2-2)

(2-3)

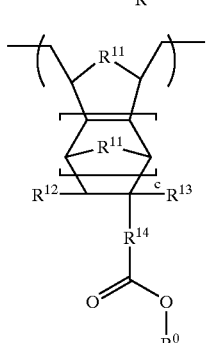

(2-4)

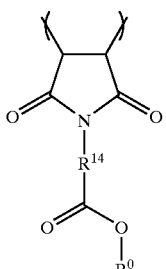

(2-5)

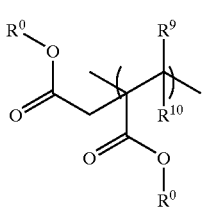

Herein $R^0$ is a group of formula (1) or (1a); $R^8$ to $R^{10}$ each are hydrogen, fluorine or a straight, branched or cyclic alkyl or fluorinated alkyl group of 1 to 20 carbon atoms; $R^{11}$ is a methylene group, oxygen atom or sulfur atom; $R^{12}$ and $R^{13}$ each are hydrogen, methyl or $CH_2CO_2R^{15}$; $R^{14}$ is a straight, branched or cyclic alkylene or fluorinated alkylene group of 1 to 20 carbon atoms; and $R^{15}$ is a straight, branched or cyclic alkyl or substituted alkyl group of 1 to 20 carbon atoms; and "c" is 0 or 1.

Examples of the alkyl, fluorinated alkyl, alkylene and fluorinated alkylene groups in these formulae are the same as previously exemplified.

Illustrative examples of the substituent group having formula (1) or (1a) are given below. Herein, Et is ethyl.

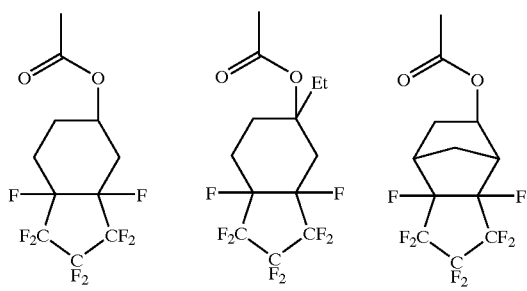
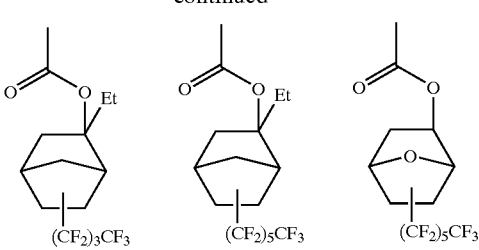
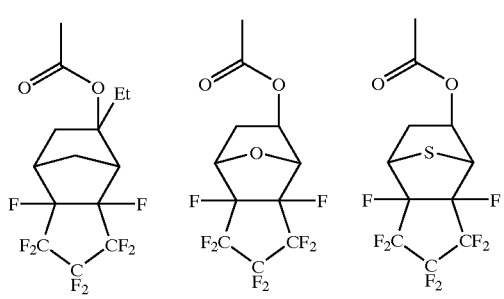
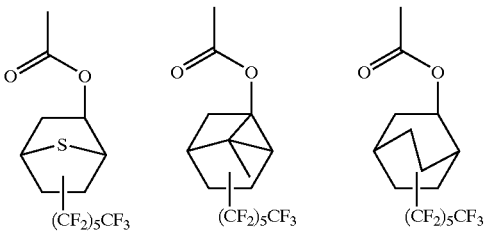
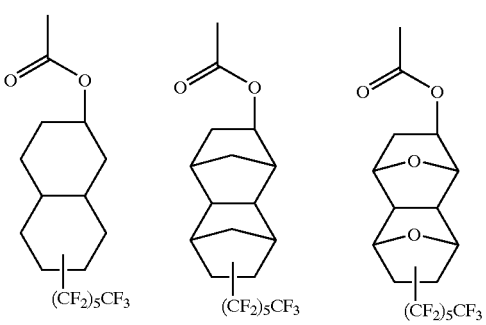
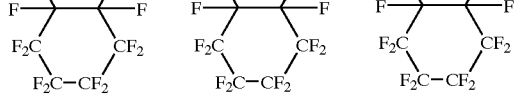
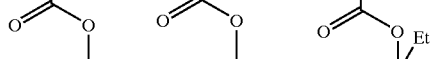
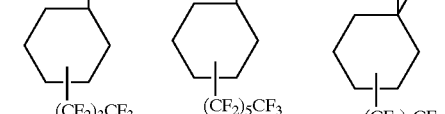
The polymers of the invention have an acid eliminating capability even when they have only one type of recurring units (2-1) to (2-5). One or more types of the following recurring units (3-1) to (3-5) may be incorporated in the inventive polymers in addition to the above units for improving the resolution of resist compositions.
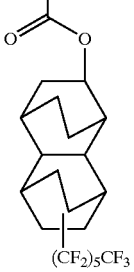
(3-1)
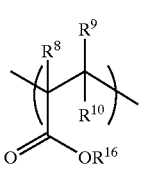

(3-2)

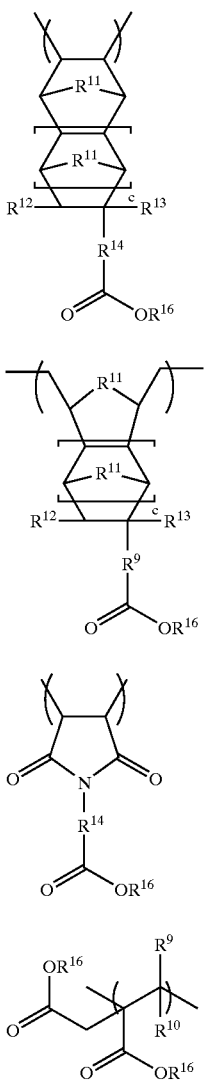

(3-3)

(3-4)

(3-5)

Herein, $R^8$ to $R^{15}$ and c are as defined above, and $R^{16}$ is an acid labile group.

The acid labile group represented by $R^{16}$ is selected from a variety of such groups, preferably from among the groups of the following formulae (4) to (6).

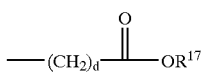
(4)

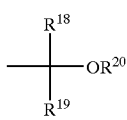
(5)

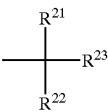
(6)

In formula (4), $R^{17}$ stands for a tertiary alkyl group of 4 to 20 carbon atoms, preferably 4 to 15 carbon atoms, an oxoalkyl group of 4 to 20 carbon atoms, or a group of the formula (6). Illustrative of the tertiary alkyl group are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl and 2-methyl-2-adamantyl. Exemplary of the oxoalkyl group are 3-oxocyclohexyl, 4-methyl-2-oxooxan-4-yl, and 5-methyl-5-oxooxolan-4-yl. Subscript d is an integer of 0 to 6.

Illustrative examples of the acid labile groups of formula (4) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

In formula (5), $R^{18}$ and $R^{19}$ stand for hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{20}$ is a monovalent hydrocarbon group of 1 to 18 carbon atoms, preferably 1 to 10 carbon atoms, which may contain a hetero atom such as oxygen, for example, straight, branched or cyclic alkyl groups and substituted ones of these alkyl groups in which some hydrogen atoms are substituted with hydroxyl, alkoxy, oxo, amino or alkylamino groups. Examples of the substituted alkyl groups are given below.

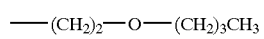
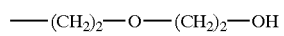
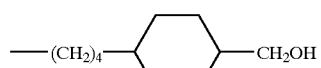
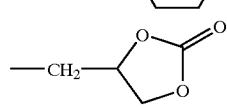

A pair of $R^{18}$ and $R^{19}$, a pair of $R^{18}$ and $R^{20}$, or a pair of $R^{19}$ and $R^{20}$ may form a ring. When they form a ring, each of $R^{18}$, $R^{19}$ and $R^{20}$ is a straight or branched alkylene group having 1 to 18 carbon atoms, preferably 1 to 10 carbon atoms.

Of the acid labile groups having formula (5), the straight and branched groups are exemplified by the following groups.

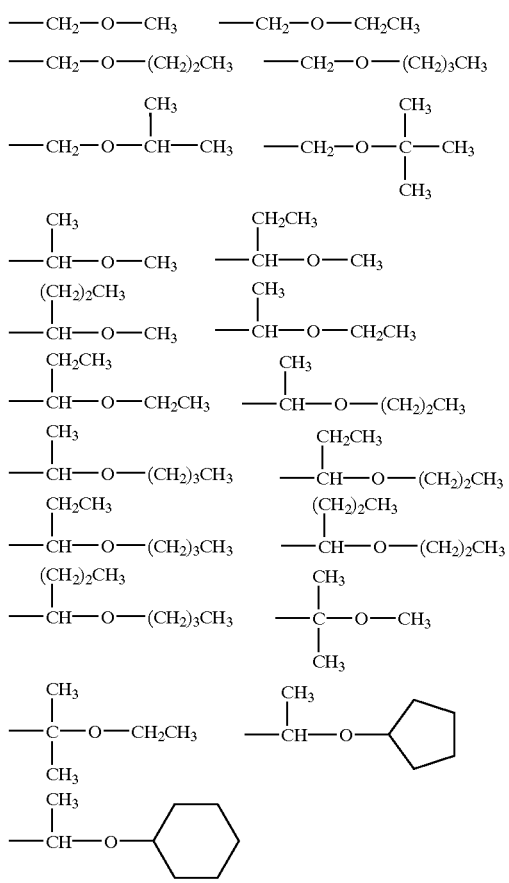

Of the acid labile groups having formula (5), examples of the cyclic groups include tetrahydrofuran-2-yl, 2-methyltetrahydrofuran-2-yl, tetrahydropyran-2-yl, and 2-methyltetrahydropyran-2-yl.

Of the acid labile groups having formula (5), ethoxyethyl, butoxyethyl and ethoxypropyl groups are preferred.

In formula (6), $R^{21}$, $R^{22}$ and $R^{23}$ are independently monovalent hydrocarbon groups, typically straight, branched or cyclic alkyl groups of 1 to 20 carbon atoms, which may contain a hetero atom such as oxygen, sulfur, nitrogen or fluorine. A pair of $R^{21}$ and $R^{22}$, a pair of $R^{21}$ and $R^{23}$, or a pair of $R^{22}$ and $R^{23}$ may bond together to form a ring.

Exemplary tertiary alkyl groups of formula (6) are tert-butyl, triethylcarbyl, 1-ethylnorbornyl, 1-methylcyclohexyl, 1-ethylcyclopentyl, 2-(2-methyl)adamantyl, 2-(2-ethyl) adamantyl, tert-amyl, 1,1,1,3,3,3-hexafluoro-2-methyl-isopropyl, and 1,1,1,3,3,3-hexafluoro-2-cyclohexyl-isopropyl as well as groups of the formulae shown below.

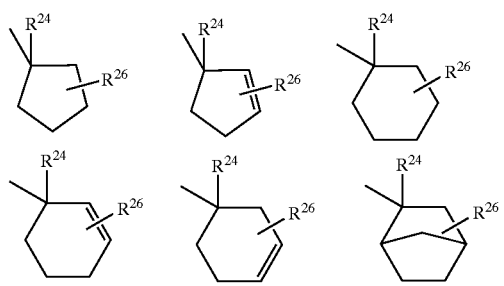

-continued

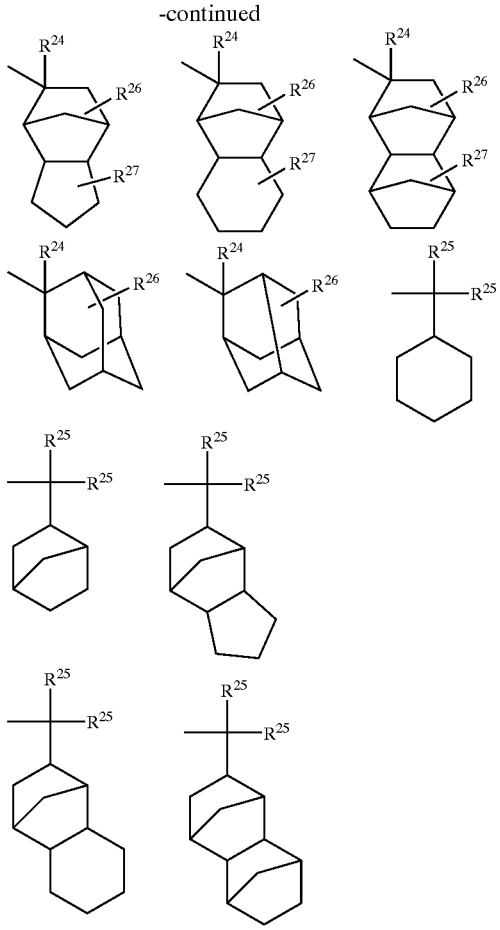

Herein, $R^{24}$ is a straight, branched or cyclic alkyl group of 1 to 6 carbon atoms, such as methyl, ethyl, propyl, isopropyl, n-butyl, sec-butyl, n-pentyl, n-hexyl, cyclopropyl, cyclopropylmethyl, cyclobutyl, cyclopentyl and cyclohexyl. $R^{25}$ is a straight, branched or cyclic alkyl group of 2 to 6 carbon atoms such as ethyl, propyl, isopropyl, n-butyl, sec-butyl, n-pentyl, n-hexyl, cyclopropyl, cyclopropylmethyl, cyclobutyl, cyclopentyl and cyclohexyl. Each of $R^{26}$ and $R^{27}$ is hydrogen or a monovalent hydrocarbon group of 1 to 6 carbon atoms which may contain a hetero atom or a monovalent hydrocarbon group of 1 to 6 carbon atoms which may be separated by a hetero atom. These hydrocarbon groups may be straight, branched or cyclic. The hetero atom is an oxygen, sulfur or nitrogen atom, which is contained or intervenes in the form of —OH, —$OR^{28}$, —O—, —S—, —S(=O)—, —$NH_2$, —$NHR^{28}$, —$N(R^{28})_2$, —NH—, or —$NR^{28}$— wherein $R^{28}$ is alkyl. Illustrative of $R^{26}$ and $R^{27}$ are methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

For the purpose of improving transparency, any one or more types of recurring units (7-1) to (7-5) shown below may be introduced into the inventive polymer in addition to the aforementioned units.

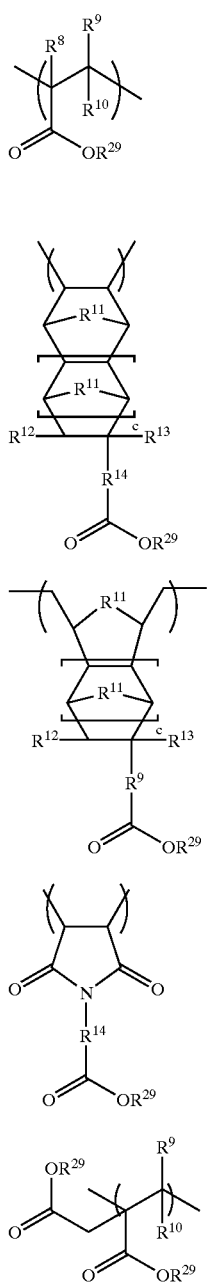

(7-1)
(7-2)
(7-3)
(7-4)
(7-5)

(8-1)
(8-2)
(8-3)
(8-4)
(8-5)

Herein, $R^8$ to $R^{15}$ and c are as defined above, and $R^{29}$ is a fluorinated alkyl group having 2 to 20 carbon atoms.

Examples of the fluorinated alkyl group represented by $R^{29}$ include 2,2,2-trifluoroethyl, 3,3,3,-trifluoropropyl 1,1,1, 3,3,3-hexafluoroisopropyl, 1,1,2,2,3,3,3-heptafluoropropyl and 2,2,3,3,4,4,5,5-octafluoropentyl.

For the purpose of improving adhesion, any one or more types of recurring units (8-1) to (8-5) shown below may be introduced into the inventive polymer in addition to the aforementioned units.

Herein, $R^8$ to $R^{15}$ and c are as defined above, and $R^{30}$ is hydrogen or an adhesive group.

Illustrative examples of the adhesive group represented by $R^{30}$ are given below.

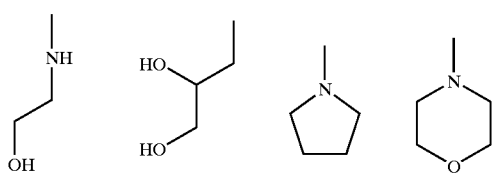

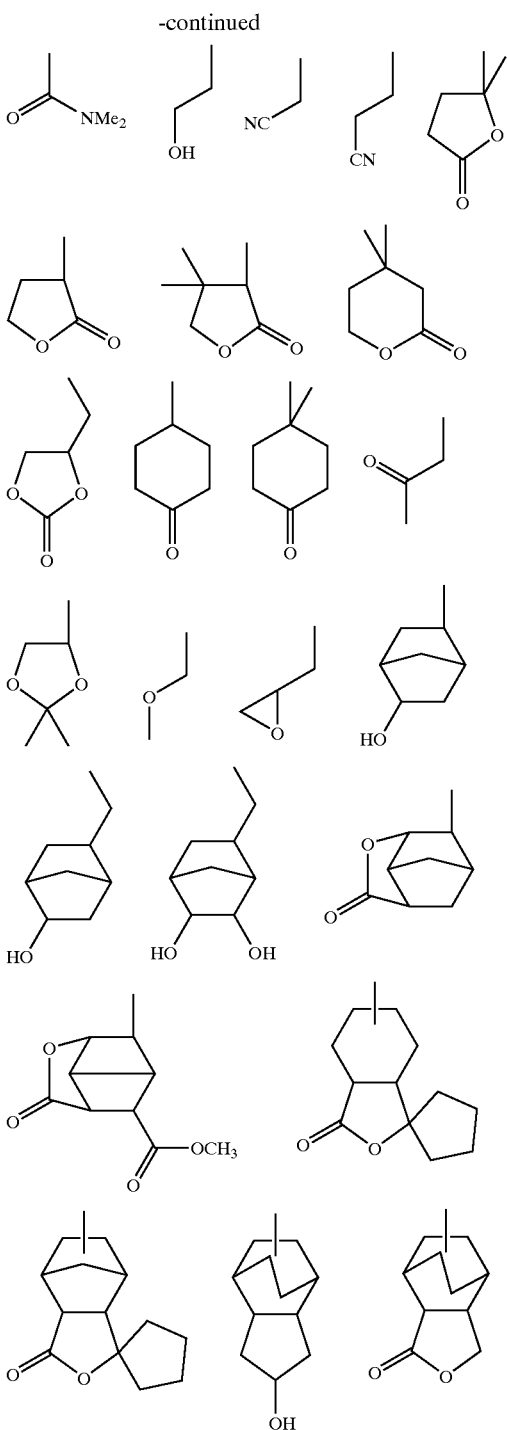
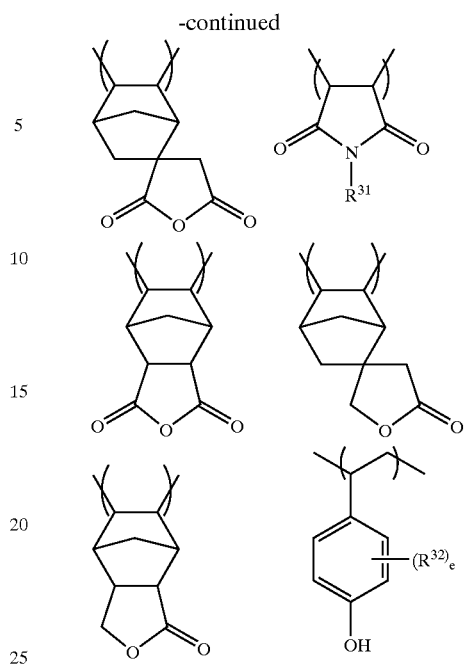

Herein, $R^{31}$ and $R^{32}$ are independently hydrogen or straight, branched or cyclic alkyl or fluorinated alkyl groups of 1 to 20 carbon atoms, and "e" is an integer of 0 to 4.

The polymer of the invention is generally synthesized by dissolving a monomer having a group of formula (1) or (1a), especially a monomer providing units (2-1) to (2-5), and optionally, an acid-eliminating monomer (3-1) to (3-5), a transparency-improving monomer (7-1) to (7-5), an adhesion-improving monomer (8-1) to (8-5) and the like in a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for preparation of the polymer of the invention are radical polymerization of triggering polymerization with radicals of 2,2'-azobisisobutyronitrile (AIBN) or the like, and ion (anion) polymerization using catalysts such as alkyl lithium. These polymerization steps may be carried out in their conventional manner.

The radical polymerization initiator used herein is not critical. Exemplary initiators include azo compounds such as AIBN, 2,2'-azobis(4-methoxy-2,4-dimethylvaleronitrile), 2,2'-azobis(2,4-dimethylvaleronitrile), and 2,2'-azobis(2,4,4-trimethylpentane); and peroxide compounds such as tert-butyl peroxypivalate, lauroyl peroxide, benzoyl peroxide and tert-butyl peroxylaurate. Water-soluble initiators include persulfate salts such as potassium persulfate, and redox combinations of potassium persulfate or peroxides such as hydrogen peroxide with reducing agents such as sodium sulfite. The amount of the polymerization initiator used is determined as appropriate in accordance with such factors as the identity of initiator and polymerization conditions, although the amount is often in the range of about 0.001 to 5% by weight, especially about 0.01 to 2% by weight based on the total weight of monomers to be polymerized.

For the polymerization reaction, a solvent may be used. The polymerization solvent used herein is preferably one which does not interfere with the polymerization reaction.

Aside from the recurring units (8-1) to (8-5), another adhesive group as shown below may be introduced into the inventive polymer for the purpose of improving adhesion.

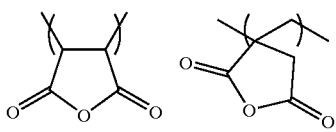

Typical solvents include ester solvents such as ethyl acetate and n-butyl acetate, ketone solvents such as acetone, methyl ethyl ketone and methyl isobutyl ketone, aliphatic or aromatic hydrocarbon solvents such as toluene, xylene and cyclohexane, alcohol solvents such as isopropyl alcohol and ethylene glycol monomethyl ether, and ether solvents such as diethyl ether, dioxane, and tetrahydrofuran. These solvents may be used alone or in admixture of two or more. Further, any of well-known molecular weight modifiers such as dodecylmercaptan may be used in the polymerization system.

The temperature of polymerization reaction varies in accordance with the identity of polymerization initiator and the boiling point of the solvent although it is often preferably in the range of about 20 to 200° C., and especially about 50 to 140° C. Any desired reactor or vessel may be used for the polymerization reaction.

From the solution or dispersion of the polymer thus obtained, the organic solvent or water serving as the reaction medium is removed by any of well-known techniques. Suitable techniques include, for example, re-precipitation followed by filtration, and heat distillation under vacuum.

The polymers of the invention are generally represented by the formula below.

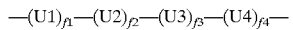

$$-(U1)_{f1}-(U2)_{f2}-(U3)_{f3}-(U4)_{f4}-$$

Herein U1 stands for units having a group of formula (1) or (1a), especially units of formulae (2-1) to (2-5), U2 stands for units having an acid-eliminating group of formulae (3-1) to (3-5), U3 stands for transparency-improving units of formulae (7-1) to (7-5), and U4 stands for units having an adhesive group of formulae (8-1) to (8-5) or other adhesive units. Subscripts f1 to f4 are numbers satisfying f1+f2+f3+f4=1, and preferably $0.1 \leq f1/(f1+f2+f3+f4) \leq 0.9$, more preferably $0.2 \leq f1/(f1+f2+f3+f4) \leq 0.5$, $0.1 \leq f2/(f1+f2+f3+f4) \leq 0.8$, more preferably $0.2 \leq f2/(f1+f2+f3+f4) \leq 0.5$, $0 \leq f3/(f1+f2+f3+f4) \leq 0.5$, more preferably $0 \leq f3/(f1+f2+f3+f4) \leq 0.3$, and $0 \leq f4/(f1+f2+f3+f4) \leq 0.5$, more preferably $0 \leq f4/(f1+f2+f3+f4) \leq 0.3$.

Desirably the polymer has a weight average molecular weight of about 1,000 to about 1,000,000, and especially about 2,000 to about 100,000.

The polymer of the invention can be used as a base resin in resist compositions, specifically chemical amplification type resist compositions, and especially chemical amplification type positive working resist compositions. It is understood that the polymer of the invention may be admixed with another polymer for the purpose of altering the dynamic properties, thermal properties, alkali solubility and other physical properties of polymer film. The type of the other polymer which can be admixed is not critical. Any of polymers known to be useful in resist use may be admixed in any desired proportion.

Resist Composition

As long as the polymer of the invention is used as a base resin, the resist composition of the invention may be prepared using well-known components. In a preferred embodiment, the chemically amplified positive resist composition is defined as comprising (A) the above-defined polymer as a base resin, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin (inventive polymer), photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Also useful are fluorinated organic solvents. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, sec-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol-1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, and 1,1,1-trifluoro-5,5-dimethyl-2,4-hexanedione.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

The solvent is preferably used in an amount of about 300 to 10,000 parts by weight, more preferably about 500 to 5,000 parts by weight per 100 parts by weight of the base resin.

Component (C)

Suitable examples of the photoacid generator (C) include onium salts of general formula (9) below, diazomethane derivatives of formula (10), glyoxime derivatives of formula (11), β-ketosulfone derivatives, disulfone derivatives, nitrobenzylsulfonate derivatives, sulfonic acid ester derivatives, and imidoyl sulfonate derivatives.

The onium salts used as the photoacid generator are of the general formula (9).

$$(R^{33})_g M^+ K^- \tag{9}$$

In the formula, $R^{33}$ is a straight, branched or cyclic alkyl of 1 to 12 carbon atoms, an aryl of 6 to 20 carbon atoms, or an aralkyl of 7 to 12 carbon atoms; $M^+$ is iodonium or sulfonium; $K^-$ is a non-nucleophilic counter-ion; and g is 2 or 3.

Illustrative examples of alkyl groups represented by $R^{33}$ include methyl, ethyl, propyl, butyl, pentyl, 2-oxocyclopentyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

The diazomethane derivatives used as the photoacid generator are of the general formula (10).

(10)

In the formula, $R^{34}$ and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{34}$ and $R^{35}$ include methyl, ethyl, propyl, butyl, amyl, cyclopentyl, cyclohexyl, norbornyl, and adamantyl. Exemplary halogenated alkyl groups include trifluoromethyl, 2,2,2-trifluoroethyl, 2,2,2-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

The glyoxime derivatives used as the photoacid generator are of the general formula (11).

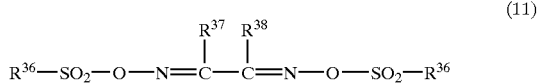

(11)

In the formula, $R^{36}$, $R^{37}$, and $R^{38}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{37}$ and $R^{38}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{36}$ to $R^{38}$ are exemplified by the same groups as mentioned above for $R^{34}$ and $R^{35}$. Examples of alkylene groups represented by $R^{37}$ and $R^{38}$ include methylene, ethylene, propylene, butylene, and hexylene.

Illustrative examples of the photoacid generator include:

onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl) phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate;

diazomethane derivatives such as bis(benzenesulfonyl)-diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl) diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-O-(p-toluenesulfonyl)-α-dimethylglyoxime and bis-O-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight per 100 parts by weight of the base resin. At less than 0.2 part, the amount of acid generated during exposure would be too small and the sensitivity and resolution be poor, whereas the addition of more than 15 parts would lower the transmittance of the resist and result in a poor resolution.

Component (D)

The basic compound (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include ammonia, primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene.

Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, nicotinic acid, and amino acid derivatives (e.g. alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable sulfonyl group-bearing nitrogenous compounds include 3-pyridinesulfonic acid and pyridinium p-toluenesulfonate.

Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (12) may also be included.

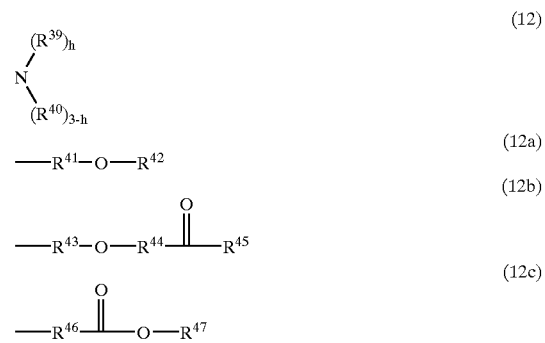

In the formulas, h is 1, 2 or 3. The side chain $R^{39}$ may be the same or different and bond together to form a ring. $R^{39}$ is represented by the above formula (12a), (12b) or (12c). The side chain $R^{40}$ may be the same or different and stands for hydrogen or a straight, branched or cyclic alkyl group of 1 to 20 carbon atoms which may contain an ether or hydroxyl group. $R^{41}$, $R^{43}$ and $R^{46}$ are independently straight or branched alkylene groups of 1 to 4 carbon atoms. $R^{42}$ and $R^{45}$ are independently hydrogen or straight, branched or cyclic alkyl groups of 1 to 20 carbon atoms which may contain one or more hydroxyl, ether, ester groups or lactone rings. $R^{44}$ is a single bond or a straight or branched alkylene group of 1 to 4 carbon atoms. $R^{47}$ is a straight, branched or cyclic alkyl group of 1 to 20 carbon atoms which may contain one or more hydroxyl, ether, ester groups or lactone rings.

Illustrative, non-limiting examples of the compounds of formula (12) include tris(2-methoxymethoxyethyl)amine, tris{(2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)-ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-

(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing basic compounds having the following general formula (13).

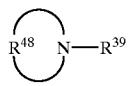

(13)

Herein R$^{39}$ is as defined above, and R$^{48}$ is a straight or branched alkylene group of 2 to 20 carbon atoms which may contain one or more carbonyl, ether, ester or sulfide groups.

Illustrative examples of the cyclic structure-bearing basic compounds having formula (13) include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (14) to (17) may be blended.

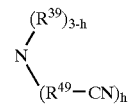

(14)

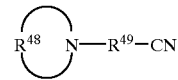

(15)

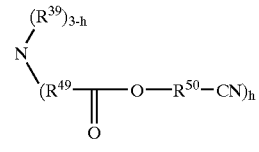

(16)

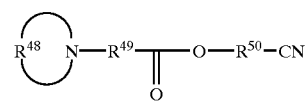

(17)

Herein, R$^{39}$, R$^{48}$ and h are as defined above, and R$^{49}$ and R$^{50}$ each are independently a straight or branched alkylene group of 1 to 4 carbon atoms.

Illustrative examples of the cyano-bearing basic compounds include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl) aminoacetonitrile, N,N-bis(2-acetoxyethyl) aminoacetonitrile, N,N-bis(2-formyloxyethyl) aminoacetonitrile, N,N-bis(2-methoxyethyl) aminoacetonitrile, N,N-bis[2-(methoxymethoxy)ethyl] aminoacetonitrile, methyl N-cyanomethyl-N-(2-methoxyethyl)-3-aminopripionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl] aminoacetonitrile, N-cyanomethyl-N-(3-hydroxy-1-propyl) aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropanate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)-ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The above-described basic compound may be used singly or in combinations of two or more thereof, and is preferably formulated in an amount of about 0.01 to 2 parts, and especially about 0.01 to 1 part by weight, per 100 parts by weight of the base resin. At less than 0.01 part, the desired effects of the basic compound would not be apparent, while the use of more than 2 parts would result in too low a resolution and sensitivity.

Component (E)

The dissolution inhibitor (E) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor. The acid labile groups may be either fluorinated ones contemplated herein or conventional fluorine-free ones.

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4, 4'-diol], 4,4'-[2,2,2-trifluoro-1-(trifluoromethyl)-ethylidene] bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylene-bis(2,6-difluorophenol), 4,4'-(4-fluorophenyl) methylene-bis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol. The acid labile substituents are the same as above formulae (4) to (6).

Illustrative, non-limiting, examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)-ethylidene]bisphenol-4, 4'-di-t-butoxycarbonyl, bis(4-(2'-tetrahydropyranyloxy) phenyl)methane, bis(4-(2'-tetrahydrofuranyloxy)phenyl )methane, bis(4-tert-butoxyphenyl )methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy) phenyl)methane, 2,2-bis(4'-(2"-tetrahydropyranyloxy)) propane, 2,2-bis(4'-(2"-tetrahydrofuranyloxy)phenyl) propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy) phenyl)methane, 1,1,2-tris(4'-(2"-tetrahydropyranyloxy) phenyl)ethane, 1,1,2-tris(4'-(2"-tetrahydrofuranyloxy) phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (E) is up to about 20 parts, and especially up to about 15 parts by weight per 100 parts by weight of the base resin in the composition. With more than 20 parts of the dissolution inhibitor, the resist composition becomes less heat resistant because of an increased content of monomer components.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Florade FC-430 and FC-431 from Sumitomo 3M Ltd., Surflon S-141 and S-145 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micro-pattern formation with, in particular, deep-UV rays having a wavelength of 254 to 120 nm, an excimer laser, especially ArF excimer laser (193 nm), $F_2$ laser (157 nm), $Kr_2$ laser (146 nm), KrAr laser (134 nm) or $Ar_2$ laser (126 nm), x-rays, or an electron beam. The desired pattern may not be obtainable outside the upper and lower limits of the above range.

The resist composition comprising a polymer having incorporated therein an ester group having a fluorinated alicyclic unit as a base resin according to the invention is sensitive to high-energy radiation, and has excellent sensitivity at a wavelength of less than 200 nm, especially less than 170 nm, significantly improved transparency by virtue of the fluorinated alicyclic units incorporated as well as satisfactory plasma etching resistance. These features of the inventive resist composition enable its use particularly as a resist having a low absorption at the exposure wavelength of a $F_2$ laser, and permit a finely defined pattern having sidewalls perpendicular to the substrate to be easily be formed, making the resist ideal as a micropatterning material in VLSI fabrication.

EXAMPLE

Examples of the invention are given below by way of illustration and not by way of limitation. The abbreviations used herein are AIBN for azobisisobutyronitrile, GPC for gel permeation chromatography, NMR for nuclear magnetic resonance, Mw for weight average molecular weight, and Mn for number average molecular weight.

Synthesis Example 1
Copolymerization of Monomer 1, 2-ethyladamantyl methacrylate and Monomer 2 (4:4:2)

In a 500-ml flask, 26.2 g of Monomer 1 shown below, 17.9 g of 2-ethyladamantyl methacrylate and 6.1 g of Monomer 2 shown below were dissolved in 100 ml of toluene. The system was fully purged of oxygen, 0.34 g of the initiator AIBN was added, and the system was heated at 60° C. at which polymerization reaction took place for 24 hours.

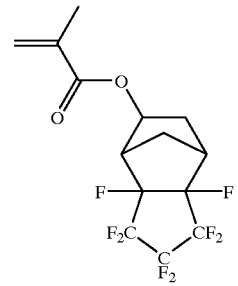

Monomer 1

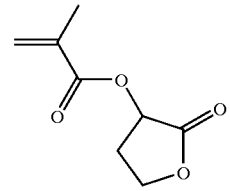

Monomer 2

The polymer thus obtained was worked up by pouring the reaction mixture into hexane whereupon the polymer precipitated. The polymer collected was dissolved in tetrahydrofuran and poured into 10 liters of hexane for precipitation. This cycle was repeated twice. The polymer was separated and dried. There was obtained 35.2 g of a white polymer, which was found to have a Mw of 14,000 as measured by the light scattering method, and a dispersity (Mw/Mn) of 1.4 as determined from the GPC elution curve. On $^1$H-NMR analysis, the polymer was found to consist of Monomer 1, 2-ethyladamantyl methacrylate and Monomer 2 in a ratio of 41:39:20.

Synthesis Example 2
Copolymerization of Monomer 1, 2,2,3,3,4,4,5,5-octafluoropentyl methacrylate, 2-ethyladamantyl methacrylate and Monomer 2 (4:2:3:1)

In a 500-ml flask, 24.6 g of Monomer 1, 10.1 g of 2,2,3,3,4,4,5,5-octafluoropentyl methacrylate, 12.6 g of 2-ethyladamantyl methacrylate and 2.9 g of Monomer 2 were dissolved in 100 ml of toluene. The system was fully purged of oxygen, 0.32 g of the initiator AIBN was added, and the system was heated at 60° C. at which polymerization reaction took place for 24 hours.

The polymer thus obtained was worked up by pouring the reaction mixture into hexane whereupon the polymer precipitated. The polymer collected was dissolved in tetrahydrofuran and poured into 10 liters of hexane for precipitation. This cycle was repeated twice. The polymer was separated and dried. There was obtained 32.3 g of a white polymer, which was found to have a Mw of 13,000 as measured by the light scattering method, and a dispersity (Mw/Mn) of 1.4 as determined from the GPC elution curve. On $^1$H-NMR analysis, the polymer was found to consist of Monomer 1, 2,2,3,3,4,4,5,5-octafluoropentyl methacrylate, 2-ethyladamantyl methacrylate and Monomer 2 in a ratio of 39:20:31:10.

Synthesis Example 3
Copolymerization of Monomer 1, 2,2,3,3,4,4,5,5-octafluoropentyl methacrylate, 2-ethyladamantyl methacrylate and Monomer 2 (3.5:1.5:3:2)

In a 500-ml flask, 22.8 g of Monomer 1, 8.0 g of 2,2,3,3,4,4,5,5-octafluoropentyl methacrylate, 13.3 g of 2-ethyladamantyl methacrylate and 6.1 g of Monomer 2 were dissolved in 100 ml of toluene. The system was fully purged of oxygen, 0.34 g of the initiator AIBN was added, and the system was heated at 60° C. at which polymerization reaction took place for 24 hours.

The polymer thus obtained was worked up by pouring the reaction mixture into hexane whereupon the polymer precipitated. The polymer collected was dissolved in tetrahydrofuran and poured into 10 liters of hexane for precipitation. This cycle was repeated twice. The polymer was separated and dried. There was obtained 34.3 g of a white polymer, which was found to have a Mw of 14,000 as measured by the light scattering method, and a dispersity (Mw/Mn) of 1.5 as determined from the GPC elution curve. On $^1$H-NMR analysis, the polymer was found to consist of Monomer 1, 2,2,3,3,4,4,5,5-octafluoropentyl methacrylate, 2-ethyladamantyl methacrylate and Monomer 2 in a ratio of 33:16:31:20.

Synthesis Example 4
Copolymerization of Monomer 3, 2-ethyladamantyl methacrylate and Monomer 2 (4.5:4:1.5)

In a 500-ml flask, 13.0 g of Monomer 3 shown below, 5.6 g of 2-ethyladamantyl methacrylate and 1.4 g of Monomer 2 were dissolved in 100 ml of toluene. The system was fully purged of oxygen, 0.28 g of the initiator AIBN was added, and the system was heated at 60° C. at which polymerization reaction took place for 24 hours.

Monomer 3

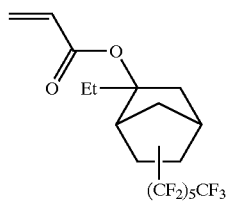

The polymer thus obtained was worked up by pouring the reaction mixture into methanol whereupon the polymer precipitated. The polymer collected was dissolved in tetrahydrofuran and poured into 5 liters of methanol for precipitation. This cycle was repeated twice. The polymer was separated and dried. There was obtained 14.0 g of a white polymer, which was found to have a Mw of 8,500 as measured by the light scattering method, and a dispersity (Mw/Mn) of 1.7 as determined from the GPC elution curve. On $^1$H-NMR analysis, the polymer was found to consist of Monomer 3, 2-ethyladamantyl methacrylate and Monomer 2 in a ratio of 45:37:18.

Synthesis Example 5
Copolymerization of Monomer 4, 2-ethyladamantyl methacrylate and Monomer 2 (4.5:4:1.5)

In a 500-ml flask, 12.8 g of Monomer 4 shown below, 5.7 g of 2-ethyladamantyl methacrylate and 1.5 g of Monomer 2 were dissolved in 100 ml of toluene. The system was fully purged of oxygen, 0.28 g of the initiator AIBN was added, and the system was heated at 60° C. at which polymerization reaction took place for 24 hours.

Monomer 4

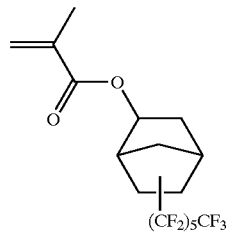

The polymer thus obtained was worked up by pouring the reaction mixture into methanol whereupon the polymer precipitated. The polymer collected was dissolved in tetrahydrofuran and poured into 5 liters of methanol for precipitation. This cycle was repeated twice. The polymer was separated and dried. There was obtained 14.3 g of a white polymer, which was found to have a Mw of 8,900 as measured by the light scattering method, and a dispersity (Mw/Mn) of 1.8 as determined from the GPC elution curve. On $^1$H-NMR analysis, the polymer was found to consist of Monomer 4, 2-ethyladamantyl methacrylate and Monomer 2 in a ratio of 44:42:14.

Synthesis Example 6
Copolymerization of Monomer 5, 2-ethyladamantyl methacrylate and Monomer 2 (4.5:4:1.5)

In a 500-ml flask, 12.9 g of Monomer 5 shown below, 5.7 g of 2-ethyladamantyl methacrylate and 1.5 g of Monomer 2 were dissolved in 100 ml of toluene. The system was fully purged of oxygen, 0.28 g of the initiator AIBN was added, and the system was heated at 60° C. at which polymerization reaction took place for 24 hours.

Monomer 5

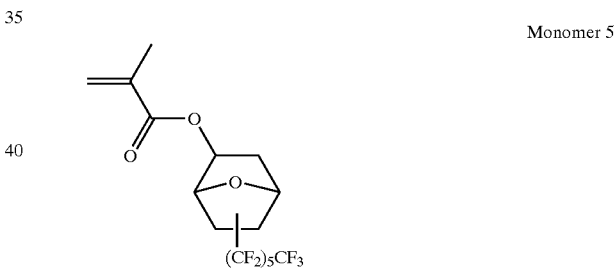

The polymer thus obtained was worked up by pouring the reaction mixture into methanol whereupon the polymer precipitated. The polymer collected was dissolved in tetrahydrofuran and poured into 5 liters of methanol for precipitation. This cycle was repeated twice. The polymer was separated and dried. There was obtained 13.2 g of a white polymer, which was found to have a Mw of 8,100 as measured by the light scattering method, and a dispersity (Mw/Mn) of 1.6 as determined from the GPC elution curve. On $^1$H-NMR analysis, the polymer was found to consist of Monomer 5, 2-ethyladamantyl methacrylate and Monomer 2 in a ratio of 44:37:19.

Synthesis Example 7
Copolymerization of Monomer 4, 1-ethylcyclopentyl methacrylate and Monomer 2 (4.5:4:1.5)

In a 500-ml flask, 13.9 g of Monomer 4, 4.5 g of 1-ethylcyclopentyl methacrylate and 1.6 g of Monomer 2 were dissolved in 100 ml of toluene. The system was fully purged of oxygen, 0.31 g of the initiator AIBN was added, and the system was heated at 60° C. at which polymerization reaction took place for 24 hours.

The polymer thus obtained was worked up by pouring the reaction mixture into methanol whereupon the polymer precipitated. The polymer collected was dissolved in tetrahydrofuran and poured into 5 liters of methanol for precipitation. This cycle was repeated twice. The polymer was separated and dried. There was obtained 13.9 g of a white polymer, which was found to have a Mw of 8,200 as measured by the light scattering method, and a dispersity (Mw/Mn) of 1.59 as determined from the GPC elution curve. On $^1$H-NMR analysis, the polymer was found to consist of Monomer 4, 1-ethylcyclopentyl methacrylate and Monomer 2 in a ratio of 42:40:18.

Reference Example 1
Synthesis of Monomer 1

In a nitrogen stream, a stainless steel autoclave having a volume of 2 liters was charged with 747 g of octafluorocyclopentene and 74 g of cyclopentadiene. After closure, the autoclave was heated at 170° C. and maintained at the temperature for 72 hours. The autoclave was cooled with ice for reducing the internal pressure whereupon the contents were transferred into a 2-liter eggplant flask. Vacuum distillation yielded 193 g of the compound (18) shown below.

In a nitrogen stream, 100 g of the compound (18) and 1.2 liters of dichloromethane were added to a 2-liter eggplant flask. Then 266 g of m-chlorobenzoic acid was added to the contents at room temperature, which were stirred for 48 hours at room temperature. An aqueous solution of sodium hydrogen sulfite was added dropwise at room temperature whereby the excess reagents were decomposed away. The solution was diluted with a large excess of ethyl acetate and washed with a 0.5N sodium hydroxide aqueous solution, a saturated sodium hydrogen carbonate aqueous solution, deionized water, then a saturated sodium chloride aqueous solution. The organic layer thus obtained was dried over a suitable amount of magnesium sulfate, concentrated in vacuum by means of an evaporator, separated and purified by silica gel column chromatography, yielding 53 g of the compound (19) shown below.

In a nitrogen atmosphere, the entire amount of the compound (19) and 1.8 liters of tetrahydrofuran were added to a 2-liter eggplant flask. Under ice cooling, 6.8 g of lithium aluminum hydride was added to the contents, which were stirred for 3 hours at 0° C., then for a further 12 hours at room temperature. The solution was then diluted with a large amount of tetrahydrofuran, and 10 ml of deionized water was added thereto. The solution was stirred for one hour at room temperature whereby the excess reagents were decomposed away. The precipitate was filtered off using silica gel. The filtrate was concentrated in vacuum by means of an evaporator and separated and purified by silica gel column chromatography, yielding 36 g of the compound (20) shown below.

In a nitrogen atmosphere, the entire amount of the compound (20), 157 ml of methacrylic acid and 1.3 g of hydroquinone were added to a 1-liter eggplant flask. At room temperature, 18.8 g of conc. sulfuric acid was added to the contents, which were stirred for 5 hours at 60° C. The solution was then diluted with a large amount of ethyl acetate. An appropriate amount of deionized water was added, and an organic layer was extracted. The organic layer was washed with a saturated sodium hydrogen carbonate aqueous solution, deionized water, then a saturated sodium chloride aqueous solution. The organic layer thus obtained was dried over magnesium sulfate, concentrated in vacuum by means of an evaporator, separated and purified by silica gel column chromatography, yielding 28.3 g of Monomer 1.

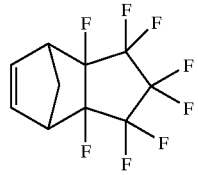

(18)

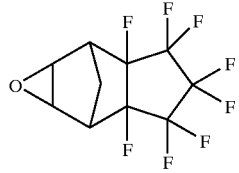

(19)

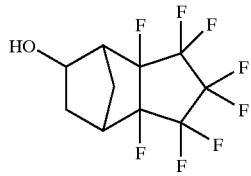

(20)

Reference Example 2
Synthesis of Monomers 3, 4 and 5

In a nitrogen stream, a stainless steel autoclave having a volume of 2 liters was charged with 19.2 g of perfluorohexylethylene and 100 g of dicyclopentadiene. After closure, the autoclave was heated at 170° C. and maintained at the temperature for 24 hours. The autoclave was cooled with ice for reducing the internal pressure whereupon the contents were transferred into a 2-liter eggplant flask. Vacuum distillation yielded 109.5 g of the compound (21) shown below.

In a nitrogen atmosphere, 80 g of the compound (21) was placed in a 1-liter eggplant flask, to which 130 g of trifluoroacetic acid was added dropwise. After the completion of dropwise addition, reaction was effected at 50° C. for 6 hours. At the end of reaction, the reaction solution was cooled to room temperature and 400 ml of hexane was added thereto. The organic layer was washed three times with 400 ml of water. The organic layer was then washed with 400 ml of a 26% sodium hydroxide aqueous solution and evaporated to dryness by means of an evaporator. The organic matter thus obtained was dissolved in 400 ml of methanol. Potassium carbonate was added to the solution, which was stirred for 12 hours at room temperature. The methanol was evaporated off by means of an evaporator, after which the organic matter was dissolved in 400 ml of ether and washed twice with 400 ml of water. After the organic layer was dried over magnesium sulfate, the solvent was removed therefrom by means of an evaporator and a vacuum pump, obtaining 81 g of a crude product of the compound (22) shown below.

The entire amount of compound (22) in the crude form was dissolved in 160 g of acetone. Under an ice bath, oxidation reaction took placed in the presence of a Jones reagent. By adding 30 ml of isopropanol, the excessive reagent was quenched. The organic matter was dissolved in 300 ml of hexane and washed with 300 ml of water. The organic layer was washed with a saturated sodium hydrogen carbonate aqueous solution and a saturated sodium chloride aqueous solution, then dried over magnesium sulfate. Hexane was evaporated off by means of an evaporator, obtaining 78 g of a crude product of the compound (23) shown below.

The entire amount of compound (23) in the crude form was dissolved in 80 g of THF. Under an ice bath, this solution was added dropwise to a THF solution of ethyl magnesium bromide which had been separately synthesized in a 1-liter flask. At the end of dropwise addition, the solution was aged for 5 hours. After 300 ml of hexane was added to the system, 300 ml of a saturated ammonium chloride aqueous solution was added dropwise. The organic layer was washed with a saturated sodium chloride solution and dried over magnesium sulfate. After hexane was evaporated off by means of an evaporator, vacuum distillation was effected to yield 65 g of the compound (24) shown below.

In a nitrogen atmosphere, a 1-liter eggplant flask was charged with 63 g of compound (24), 14.1 g of acrylic chloride, 120 g of toluene, 0.5 g of phenothiazine and 0.5 g of dimethylaminopyridine. Triethylamine, 17.7 g, was added dropwise to the solution, which was aged at 80° C. for 3 hours. After cooling to room temperature, 300 ml of ether was poured to the solution and 300 ml of water added thereto. The organic layer was washed with a formic acid aqueous solution, a saturated potassium carbonate aqueous solution and a saturated sodium chloride solution, and dried over magnesium sulfate. After vacuum concentration by means of an evaporator, vacuum distillation was effected to yield 59.3 g of Monomer 3.

By following the above procedure and effecting reaction of compound (22) with methacrylic chloride, Monomer 4 was produced. By replacing the dicyclopentadiene used as the starting reactant for the synthesis of compound (21) by furan, there was obtained an oxygen-bridged compound (25), from which Monomer 5 was produced by following the above procedure.

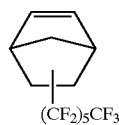
(21)

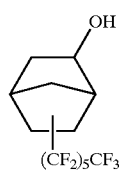
(22)

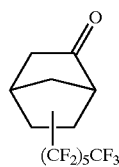
(23)

(24)

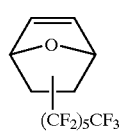
(25)

Evaluation

Polymer Transmittance Measurement

The polymers obtained in Synthesis Examples 1 to 7, designated Polymers 1 to 7, respectively, were determined for transmittance. Three other polymers were furnished for comparison purposes. Comparative Polymer 1 is a monodisperse polyhydroxystyrene having a molecular weight of 10,000 and a dispersity (Mw/Mn) of 1.1 in which 30% of hydroxyl groups are replaced by tetrahydropyranyl groups. Similarly, Comparative Polymer 2 is polymethyl methacrylate having a molecular weight of 15,000 and a dispersity (Mw/Mn) of 1.7; and Comparative Polymer 3 is a novolac polymer having a meta/para ratio of 40/60, a molecular weight of 9,000 and a dispersity (Mw/Mn) of 2.5.

Each polymer, 1 g, was thoroughly dissolved in 20 g of propylene glycol monomethyl ether acetate (PGMEA), and passed through a 0.2-$\mu$m filter, obtaining a polymer solution. The polymer solution was spin coated onto a $MgF_2$ substrate and baked on a hot plate at 100° C. for 90 seconds, forming a polymer layer of 100 nm thick on the substrate. Using a vacuum ultraviolet spectrometer (VUV-200S by Nihon Bunko K.K.), the polymer layer was measured for transmittance at 248 nm, 193 nm and 157 nm. The results are shown in Table 1.

TABLE 1

| | Transmittance (%) | | |
|---|---|---|---|
| | 248 nm | 193 nm | 157 nm |
| Polymer 1 | 92 | 85 | 39 |
| Polymer 2 | 92 | 86 | 40 |
| Polymer 3 | 92 | 84 | 36 |
| Polymer 4 | 90 | 90 | 45 |
| Polymer 5 | 90 | 88 | 46 |
| Polymer 6 | 90 | 87 | 43 |
| Polymer 7 | 89 | 89 | 42 |
| Comparative Polymer 1 | 90 | 5 | 15 |
| Comparative Polymer 2 | 91 | 80 | 12 |
| Comparative Polymer 3 | 82 | 6 | 17 |

Resist Preparation and Exposure

Resist solutions were prepared in a conventional manner by formulating the polymer, photoacid generator (PAG1 or PAG2), basic compound, dissolution inhibitor (DRI1) and solvent in the amounts shown in Table 2.

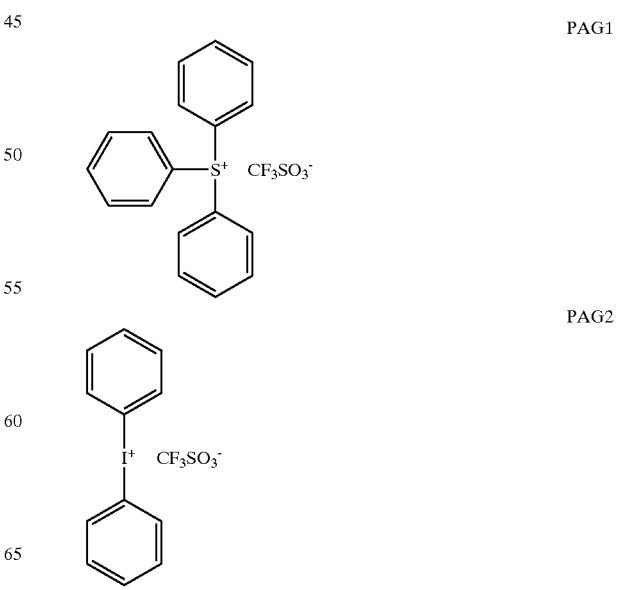

-continued

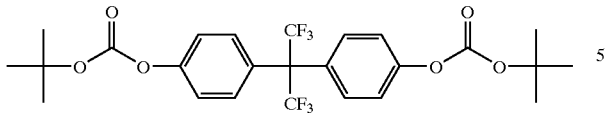
DRI 1

TBA: tributylamine
TEA: triethanolamine
PGMEA: propylene glycol monomethyl ether acetate On silicon wafers having a film of DUV-30 (Brewer Science) coated to a thickness of 55 nm, the resist solutions were spin coated, then baked on a hot plate at 100° C. for 90 seconds to give resist films having a thickness of 200 nm. The resist films were exposed by means of an $F_2$ laser (VUVES Lithotec Japan Co., Ltd.) while varying the exposure dose. Immediately after exposure, the resist films were baked at 120° C. for 90 seconds and then developed for 60 seconds with a 2.38% aqueous solution of tetramethylammonium hydroxide. The film thickness was measured in different dose areas. From the residual film thickness-to-dose relationship, the sensitivity (Eth) giving a film thickness 0 was determined. The results are shown in Table 2.

TABLE 2

| Polymer (pbw) | Photoacid generator (pbw) | Basic compound (pbw) | Dissolution inhibitor (pbw) | Solvent (pbw) | Eth, mJ/cm² |
|---|---|---|---|---|---|
| Polymer 1 (100) | PAG1 (2) | TBA (0.1) | — | PGMEA (1,000) | 45 |
| Polymer 2 (100) | PAG1 (2) | TBA (0.1) | — | PGMEA (1,000) | 23 |
| Polymer 3 (100) | PAG1 (2) | TBA (0.1) | — | PGMEA (1,000) | 33 |
| Polymer 1 (100) | PAG1 (2) | TBA (0.1) | DRI1 (10) | PGMEA (1,000) | 40 |
| Polymer 1 (100) | PAG2 (2) | TBA (0.1) | — | PGMEA (1,000) | 35 |
| Polymer 1 (100) | PAG1 (2) | TEA (100) | — | PGMEA (1,000) | 38 |
| Polymer 4 (100) | PAG1 (2) | TBA (0.1) | — | PGMEA (1,000) | 25 |
| Polymer 5 (100) | PAG1 (2) | TBA (0.1) | — | PGMEA (1,000) | 22 |
| Polymer 6 (100) | PAG1 (2) | TBA (0.1) | — | PGMEA (1,000) | 18 |
| Polymer 7 (100) | PAG1 (2) | TBA (0.1) | — | PGMEA (1,000) | 22 |
| Polymer 4 (100) | PAG1 (2) | TBA (0.1) | DRI1 (10) | PGMEA (1,000) | 22 |
| Polymer 4 (100) | PAG2 (2) | TBA (0.1) | — | PGMEA (1,000) | 18 |
| Polymer 4 (100) | PAG1 (2) | TEA (0.1) | — | PGMEA (1,000) | 26 |

As is evident from Tables 1 and 2, resist compositions using polymers within the scope of the invention have a satisfactory transparency at the wavelength (157 nm) of the $F_2$ laser. It was also confirmed that upon exposure in VUVES, these resist compositions exerted the positive working effect that the film thickness decreased with an increasing exposure dose.

Japanese Patent Application Nos. 2001-053664 and 2001-053669 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer containing a group of the following formula (1) and having a weight average molecular weight of 1,000 to 500,000,

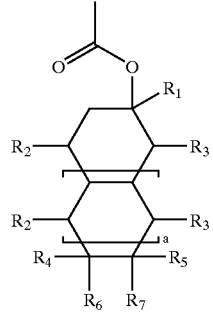

(1)

wherein $R^1$ is hydrogen, fluorine or a straight, branched or cyclic alkyl or fluorinated alkyl group of 1 to 20 carbon atoms, and $R^2$ and $R^3$ bond together to form a ring such that each is an alkylene group of 1 to 20 carbon atoms which optionally contains an oxygen, sulfur or nitrogen hetero atom, $R^4$ and $R^5$ each are hydrogen or fluorine, $R^6$ and $R^7$ each are hydrogen, fluorine or a straight, branched or cyclic alkyl or fluorinated alkyl group of 1 to 20 carbon atoms, in which case at least one of $R^6$ and $R^7$ is a fluorinated alkyl group of 1 to 20 carbon atoms, or alternatively $R^6$ and $R^7$ bond together to form a ring and in that event, each is a straight, branched or cyclic alkylene or fluorinated alkylene group of 1 to 20 carbon atoms, and "a" is 0 or 1.

2. The polymer of claim 1 having a partial structure of any one of the following formulae (2-1) to (2-5):

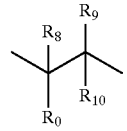
(2-1)

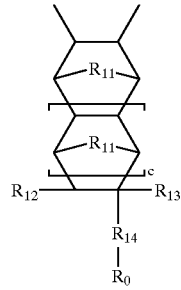
(2-2)

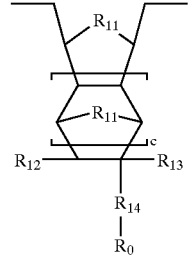
(2-3)

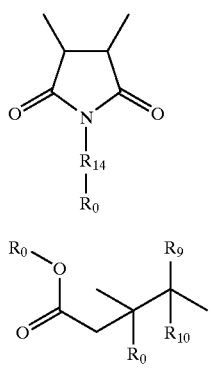

(2-4)

(2-5)

wherein R⁰ is a group of formula (1) in claim 1, $R^8$ to $R^{10}$ each are hydrogen, fluorine or a straight, branched or cyclic alkyl or fluorinated alkyl group of 1 to 20 carbon atoms, $R^{11}$ is a methylene group, oxygen atom or sulfur atom, $R^{12}$ and $R^{13}$ each are hydrogen, methyl or $CH_2CO_2R^{15}$, $R^{14}$ is a straight, branched or cyclic alkylene or fluorinated alkylene group of 1 to 20 carbon atoms, $R^{15}$ is a straight, branched or cyclic alkyl or substituted alkyl group of 1 to 20 carbon atoms, and "c" is 0 or 1.

3. The polymer of claim 2 which additionally comprises recurring units of one of formulae (3-1) to (3-5):

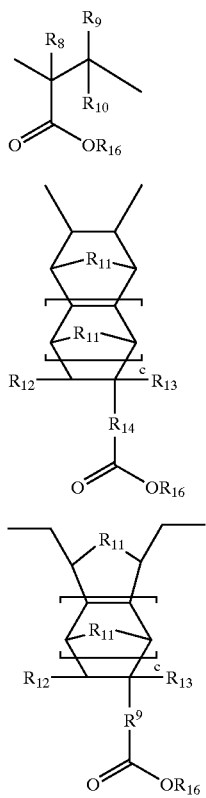

(3-1)

(3-2)

(3-3)

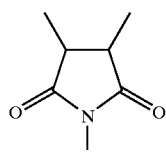

(3-4)

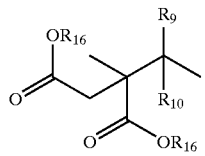

(3-5)

wherein, $R^8$ to $R^{15}$ and c are as defined above, and $R^{16}$ is an acid labile group.

4. The polymer of claim 2 which additional comprises one or more recurring units of one of the formulae (7-1) to (7-5)

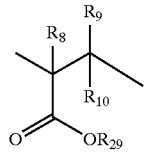

(7-1)

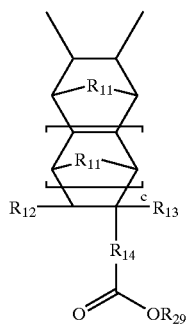

(7-2)

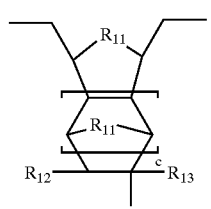

(7-3)

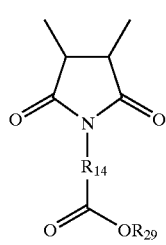

(7-4)

-continued (7-5)

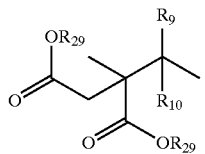

wherein, $R^8$ to $R^{15}$ and c are as defined above, and $R^{29}$ is a fluorinated alkyl group having 2 to 20 carbon atoms.

5. The polymer of claim 2 which additional comprises one or more recurring units of one of the formulae (8-1) to (8-5):

(8-1)

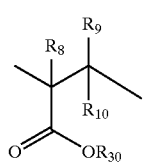

(8-2)

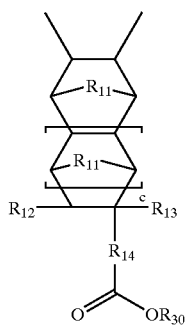

(8-3)

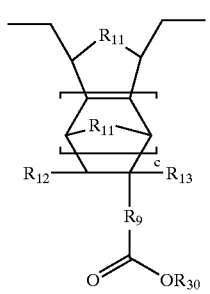

(8-4)

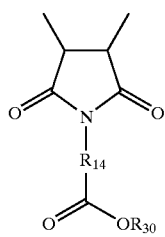

(8-5)

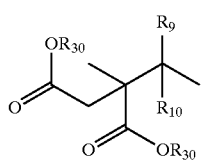

wherein, $R^8$ to $R^{15}$ and c are as defined above, and $R^{30}$ is hydrogen or an adhesive group.

6. A resist composition comprising the polymer of claim 1.

7. A process for forming a resist pattern comprising the steps of:

applying the resist composition of claim 6 onto a substrate to form a coating, heat treating the coating and then exposing it to high-energy radiation in a wavelength band of 100 to 180 nm or 1 to 30 nm through a photo mask, and optionally heat treating the exposed coating and developing it with a developer.

8. The pattern forming process of claim 7 wherein the high-energy radiation is an $F_2$ laser beam, $Ar_2$ laser beam or soft x-ray.

9. A chemically amplified, positive resist composition comprising (A) the polymer of claim 1, (B) an organic solvent, and (C) a photoacid generator.

10. The resist composition of claim 9 further comprising (D) a basic compound.

11. The resist composition of claim 9 further comprising (E) a dissolution inhibitor.

12. A polymer containing a group of the following formula (1a) and having a weight average molecular weight of 1,000 to 500,000:

(1a)

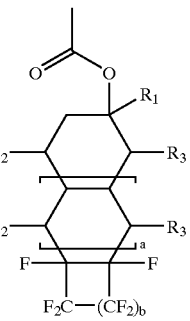

wherein $R^1$ to $R^3$ each are hydrogen, fluorine or a straight, branched or cyclic alkyl or fluorinated alkyl group of 1 to 20 carbon atoms, or alternatively $R^2$ and $R^3$ bond together to form a ring and in that event, each is an alkylene group of 1 to 20 carbon atoms which optionally contains a hetero atom such as oxygen, sulfur or nitrogen, "a" is 0 or 1, and "b" is an integer of 1 to 4.

13. The polymer of claim 12 having a partial structure of any one of the following formulae (2-1) to (2-5):

(2-1)

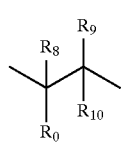

(2-2)

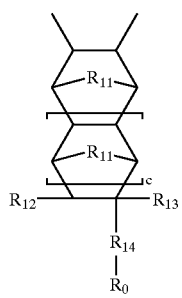

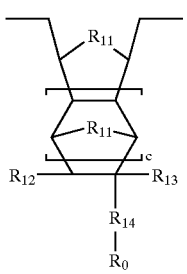
(2-3)

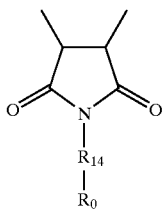
(2-4)

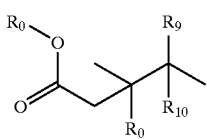
(2-5)

wherein R⁰ is a group of formula (1a) in claim 2, $R^8$ to $R^{10}$ each are hydrogen, fluorine or a straight, branched or cyclic alkyl or fluorinated alkyl group of 1 to 20 carbon atoms, $R^{11}$ is a methylene group, oxygen atom or sulfur atom, $R^{12}$ and $R^{13}$ each are hydrogen, methyl or $CH_2CO_2R^{15}$, $R^{14}$ is a straight, branched or cyclic alkylene or fluorinated alkylene group of 1 to 20 carbon atoms, $R^{15}$ is a straight, branched or cyclic alkyl or substituted alkyl group of 1 to 20 carbon atoms, and "c" is 0 or 1.

14. The polymer of claim 13 which additionally comprises one or more recurring units of one of formulae (3-1) to (3-5):

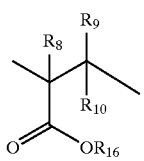
(3-1)

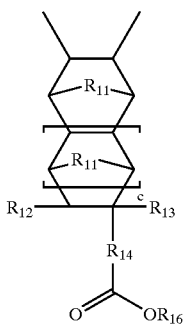
(3-2)

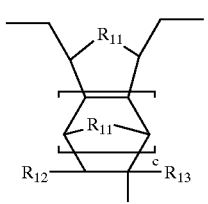
(3-3)

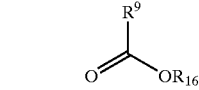
(3-4)

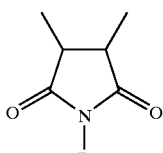
(3-5)

wherein, $R^8$ to $R^{15}$ and c are as defined above, and $R^{16}$ is an acid labile group.

15. The polymer of claim 13 which additional comprises one or more recurring units of one of the formulae (7-1) to (7-5)

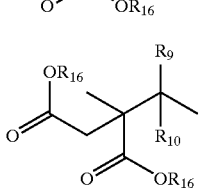
(7-1)

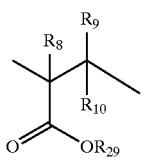
(7-2)

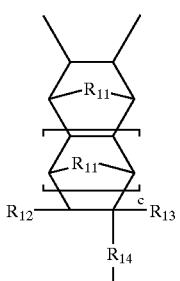

(7-3)

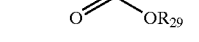

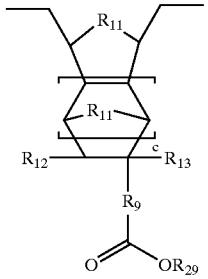

(7-4)

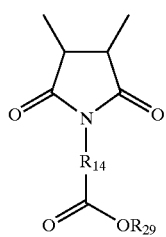

(7-5)

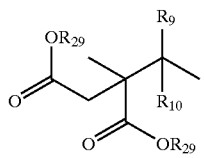

wherein, $R^8$ $R^{15}$ and c are as defined above, and $R^{29}$ is a fluorinated alkyl group having 2 to 20 carbon atoms.

16. The polymer of claim 13 which additional comprises one or more recurring units of one of the formulae (8-1) to (8-5):

(8-1)

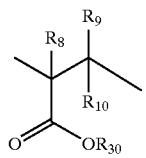

(8-2)

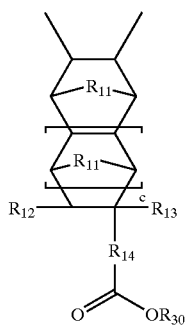

(8-3)

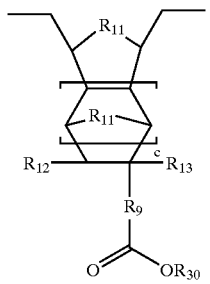

(8-4)

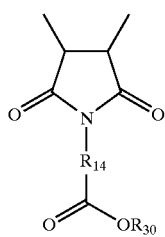

(8-5)

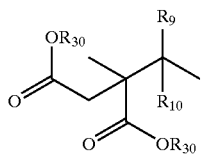

wherein, $R^8$ to $R^{15}$ and c are as defined above, and $R^{30}$ is hydrogen or an adhesive group.

17. A resist composition comprising the polymer of claim 12.

18. A process for forming a resist pattern comprising the steps of:

applying the resist composition of claim 17 onto a substrate to form a coating, heat treating the coating and then exposing it to high-energy radiation in a wavelength band of 100 to 180 nm or 1 to 30 nm through a photo mask, and optionally heat treating the exposed coating and developing it with a developer.

19. The pattern forming process of claim 18 wherein the high-energy radiation is an $F_2$ laser beam, $Ar_2$ laser beam or soft x-ray.

20. A chemically amplified, positive resist composition comprising (A) the polymer of claim 12, (B) an organic solvent, and (C) a photoacid generator.

21. The resist composition of claim 20 further comprising (D) a basic compound.

22. The resist composition of claim 20 further comprising (E) a dissolution inhibitor.

* * * * *